United States Patent [19]

Lu et al.

[11] Patent Number: 5,933,343
[45] Date of Patent: Aug. 3, 1999

[54] MULTI-DECK POWER CONVERTER MODULE

[75] Inventors: Qun Lu, Lexington; Paul E. Grandmont, Whitman; Shih-Chang Liu, Brighton, all of Mass.

[73] Assignee: International Power Devices, Inc., Allston, Mass.

[21] Appl. No.: 09/158,221

[22] Filed: Sep. 22, 1998

Related U.S. Application Data

[63] Continuation of application No. 08/803,980, Feb. 21, 1997, Pat. No. 5,812,387.

[51] Int. Cl.[6] .................................................. H02M 1/00
[52] U.S. Cl. ............................................ 363/144; 361/790
[58] Field of Search ............................ 363/144; 361/742, 361/758, 784, 790

[56] References Cited

U.S. PATENT DOCUMENTS

| | | |
|---|---|---|
| D. 340,907 | 11/1993 | Smith et al. . |
| 4,908,738 | 3/1990 | Kobari et al. . |
| 5,418,688 | 5/1995 | Hertz et al. . |
| 5,497,291 | 3/1996 | Hosen . |
| 5,579,217 | 11/1996 | Deam et al. . |
| 5,761,050 | 6/1998 | Archer ..................................... 361/790 |
| 5,812,387 | 9/1998 | Lu et al. ................................. 363/144 |
| 5,825,633 | 10/1998 | Bulalski et al. ........................ 361/790 |

OTHER PUBLICATIONS

Lambda'a P series, More modualr, RM, PM and PP Series, Product Description (Mar. 1994).

*Primary Examiner*—Peter S. Wong
*Assistant Examiner*—Bao Q. Vu
*Attorney, Agent, or Firm*—Fish & Richardson P.C.

[57] ABSTRACT

A multi-deck power converter module assembly for connection with a substrate (e.g., a host board) having connection regions disposed on its surface includes a second circuit board positioned over a first circuit board, the second circuit board having apertures extending from an upper surface to a lower surface of the second circuit board. At least two rail members are positioned over the second circuit board, each rail member having a first and a second plurality of holes. A pair of spacers are disposed between the first and second circuit boards, each spacer extending through one of the apertures of the second circuit board and received within one of the first plurality of holes of one of the rail members. Terminal pins are attached to the first circuit board, at least one terminal pin extending through the second circuit board and a corresponding one of the second plurality of holes for connection to one of the connection regions on the substrate. Each of the second plurality of holes is sized to allow the rail members to be slidably positioned over the terminal pins during assembly of the power converter module.

17 Claims, 3 Drawing Sheets

MULTI-DECK POWER CONVERTER MODULE

CROSS REFERENCE TO RELATED APPLICATIONS

This is a continuation of U.S. application Ser. No. 08/803,980, filed Feb. 21, 1997, issued as U.S. Pat. No. 5,812,387.

BACKGROUND OF THE INVENTION

This invention relates to power converter modules, particularly multi-deck power converter modules.

In computer, data communication and telecommunication applications, power converters (e.g., DC—DC converters) are provided in modular form and designed to be mounted on a host board (e.g., motherboard) to provide power for other circuits on the host board. Recently, greater attention has been directed toward reducing the size while maintaining energy efficiency and performance of the power converter so that the overall size of the host board can be reduced or the complexity of the host board can be increased.

One approach for decreasing the size of modular power converters is to use a multi-deck approach in which two or more circuit boards are physically stacked one above the other and electrically interconnected to each other. In a multi-deck arrangement, one board is positioned above another board with the upper board having terminal pins which mount to the lower board. The multi-deck arrangement is particularly advantageous in applications in which the height of the power module can be sacrificed for layout area on the host board. In addition, multi-decked arrangements offer the advantage of allowing electronic components to be mounted to both sides of the upper board of the modular power converter.

SUMMARY OF THE INVENTION

This invention provides a multi-deck power converter module including rail members which mechanically support the terminal pins used to electrically interconnect the individual boards of the module to each other, as well as to the circuit board to which the module is mounted. The rail members are part of an open-frame arrangement which provides the electronic components of the power converter improved access to cooling air (e.g., provided by a circulating fan), thereby providing a cooler running module.

In general, the invention features, a multi-deck power converter module assembly for connection with a substrate (e.g., a host board) having connection regions disposed on its surface. The power converter includes a first circuit board and a second circuit board positioned over the first circuit board. The second circuit board has apertures extending from an upper surface to a lower surface. At least two rail members are positioned over the second circuit board, each rail member having a first and a second plurality of holes. A pair of spacers are disposed between the first and second circuit boards, each spacer extending through one of the apertures of the second circuit board and received within one of the first plurality of holes of one of the rail members. Terminal pins are attached to the first circuit board, at least one terminal pin extending through the second circuit board and a corresponding one of the second plurality of holes of the rail members for connection to one of the connection regions on the substrate. Each of the second plurality of holes is sized to allow the rail members to be slidably positioned over the terminal pins during assembly of the power converter module.

The invention utilizes rail members to mechanically support the terminal pins before, during and after mounting to a host board. Thus, solder joints at the electrical interconnections between the boards of the power converter are not necessary for mechanical support. Mechanical support for the terminal pins is particularly important when the module is being soldered to a host board or other wiring substrate. Without support for the terminal pins during this soldering operation, the terminal pins can come loose and separate from the individual boards (particularly, the board furthest from the heat sink) of the module.

The ability to attach and remove the rail members from the spacers of the power converter module provides another important advantage. The manufacturer is able to keep an available inventory of assembled multi-deck power converter modules without rail members. The inventory can be used to supply open-frame power converter modules by sliding the rail members over the terminal pins. Alternatively, the inventory can be used as well to supply power converter modules potted and encased within a housing or cover member.

Embodiments of the invention may include one or more of the following features.

Each of the rail members includes standoffs which, contact and space the module from the substrate when the module assembly is mounted to the substrate. The standoffs ensure adequate spacing for the components mounted on opposing surfaces of the boards of the power converter and establish the length of the terminal pins extending from the converter. The standoffs also precisely control the height of the module with respect to the substrate. Precise height control is particularly important, for example, in applications in which a single large heat sink (i.e., "cold plate") is positioned over a number of electronic parts mounted on the substrate. In such applications, the top surfaces of each of the electronic parts must be substantially the same height to ensure proper contact with the heat sink.

Each of the rail members includes an opening to allow increased air flow to circuit boards, thereby reducing the operating temperature of the power converter module. Each of the spacers have shoulders for accurate positioning of the circuit boards with respect to each other. The upper end of each spacer is knurled to capture the rail member. The first circuit board includes a heat sink attached thereto. The first and second circuit boards are electrically interconnected. The multi-deck power converter module assembly is a DC-DC converter.

Other features and advantages of the invention will become apparent from the following description of the preferred embodiments and from the claims.

DESCRIPTION OF THE PREFERRED EMBODIMENTS

Figure 1:
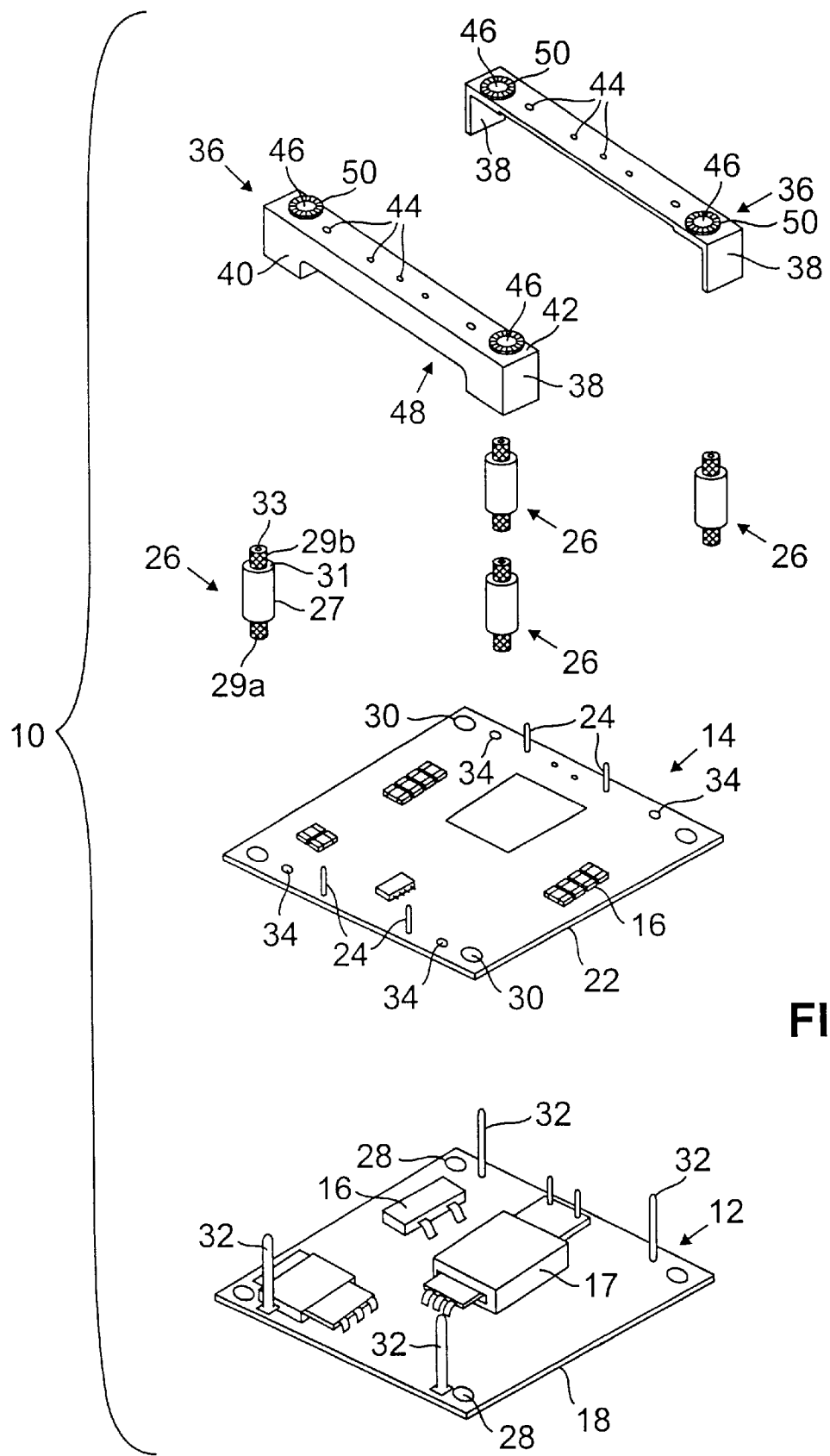
FIG. 1 is an exploded, somewhat diagrammatic, isometric view of a multi-deck power converter module of the invention.
Figure 2:
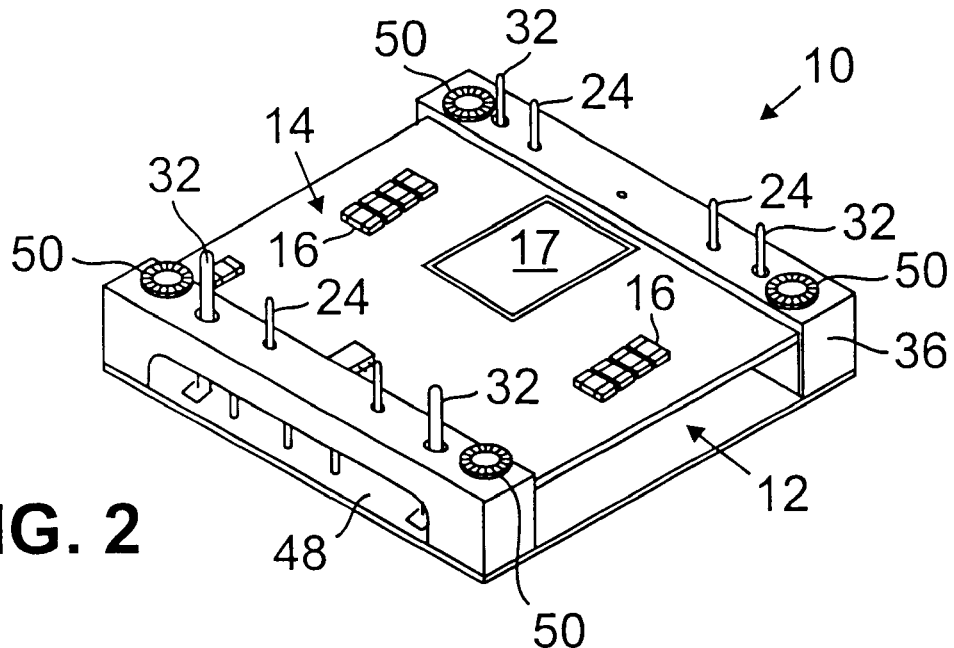
FIG. 2 is an isometric view of the multi-deck power converter module of FIG. 1 assembled and with the rail members positioned over the terminal pins.
Figure 4:
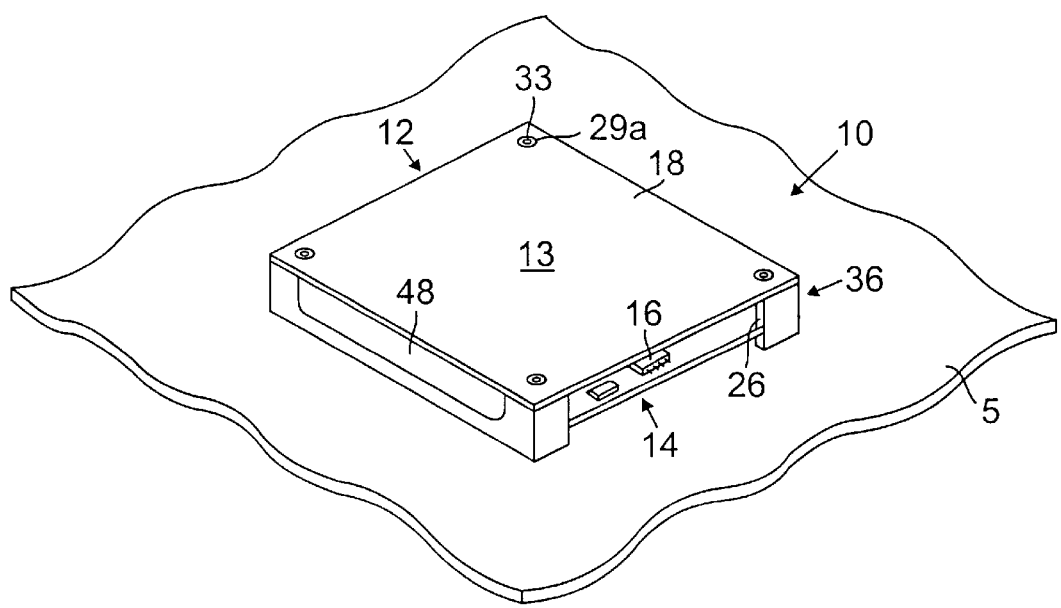
FIG. 4 is an isometric view of the multi-deck power converter module of FIG. 1 mounted to a host board.

Referring to FIGS. 1 and 2, a power converter module 10 includes a pair of printed circuit boards (PCBs), the first being a power board 12, the other being a control board 14, each having a number of electronic components 16, 17 soldered thereto. During assembly, control board 14 is positioned over power board 12 to provide a multi-deck arrangement. In operation, power converter module 10 is mounted to a host board 5 (FIG. 4) which receives the module so that control board 14 is adjacent host board 5. As shown in FIG. 4, with power converter module 10 in its mounted position, surface 13 of power board 12 is exposed to receive, for example, a finned heat sink.

Power board 12 is formed of an aluminum substrate 18 having a thickness of about 0.062 inches over which a thin insulative layer (not shown) is deposited. A conductive metal pattern (not shown) is laid out over the insulative layer to interconnect components 16 (e.g., resistors, capacitors, etc.). Components 16 may also include a planar transformer 17, such as those described in co-pending application, Ser. No. 08/693,878, assigned to the assignee of this application, and incorporated herein by reference. Components 16 which are mounted to power board 12 are associated with the power handling and generating circuitry for power converter module assembly 10 and, therefore, generate a relatively large amount of heat. Aluminum substrate 18 serves as a heat sink for dissipating heat generated by the circuitry mounted on power board 12. Input/output (I/O) terminals 32 are soldered to power board 12 and extend through plated-thru holes 34 in control board 14.

Control board 14 is formed of an insulating substrate 22 (e.g., glass epoxy laminate) having a thickness of about 0.032 inches. Control board 14 includes a conductive metal pattern (not shown) for interconnecting components 16 mounted to the control board and associated with the control circuitry and, therefore, generate much lower level signals as compared to power board 12. Pin terminals 24, soldered to control board 14, interconnect power converter module 10 to host board 5. For reasons which are discussed below, control board 14 is slightly smaller than power board 12.

Power converter module assembly 10 also includes spacers 26 which are secured within holes 28 at the four corners of power board 12 and extend through holes 30 of control circuit 14. Spacers 26, formed here of stainless steel, are used to maintain a preselected spacing between power board 12 and control board 14 and the length of terminal pins 24, 32 extending from module assembly 10. Spacers 26 have a body 27 and ends 29a, 29b which have a diameter less than that of body 27, thereby providing shoulders 31 at each end of body 27. End 29a is knurled to facilitate a tight fit within a corresponding hole 28 of power board 12. End 29b is also knurled for reasons discussed below. In the illustrated embodiment, spacers 26, when mounted within holes 28, extend upwardly about 400 mils from the surface of power board 12. Spacers 26 also include a threaded thru-hole 33 which can be used to secure a heat sink to surface 13 of power board 12 (FIG. 4). Alternatively, threaded thru-holes 33 can be used to secure module assembly 10 to host board 5.

Referring to FIG. 2, power converter module 10 is shown with control board 14 spaced from power board 12 using spacers 26 and with I/O terminals 32 and terminals pins 24 extending through holes 30 of the control board. In this state of assembly, power converter module 10 is ready for operation.

Figure 3:
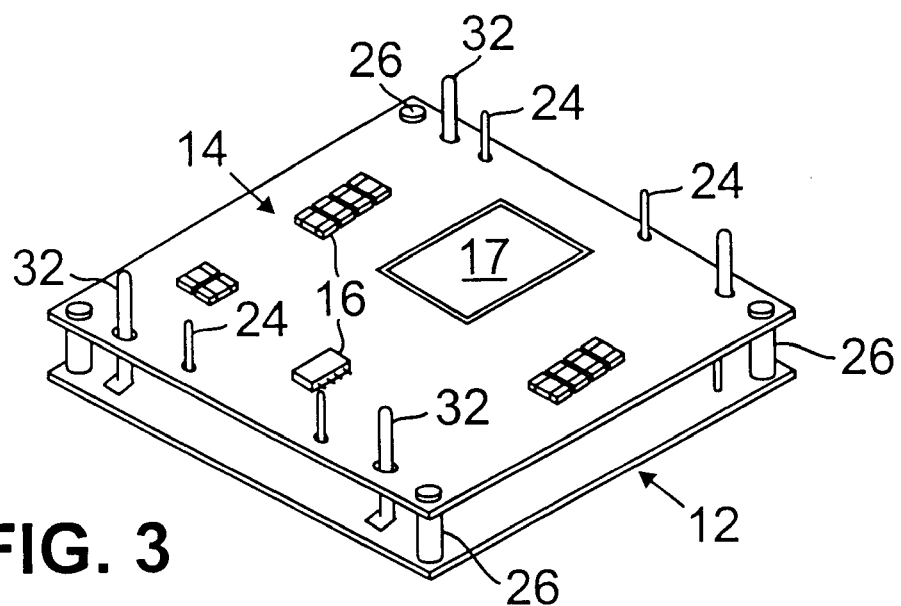
FIG. 3 is an isometric view of the multi-deck power converter module of FIG. 1 assembled and without the rail members positioned over the terminal pins.

Referring to FIGS. 1 and 3, power converter module 10 further includes a pair of rail members 36 formed of molded thermoplastic. Each rail member 36 has a pair of end walls 38 bridged by a sidewall 40 and a top wall 42. Top wall 42 includes a first set of holes 44 which are slidingly positioned over I/O terminals 32 and pin terminals 24. Each rail member 36 also includes, at each end, a second set of holes 46, larger than holes 44, each of which receives a knurled end 29b of spacer 26. Holes 46 are sized to provide a relatively tight fit between knurled ends 29b, thereby capturing and securing rail members 36 to module assembly 10.

The first set of holes are sized to closely fit around and mechanically support I/O terminals 32 and terminal pins 24, while still allowing rail members 36 to be slidingly removed from the I/O terminals and pin terminals, respectively.

As discussed above, control board 14 is sized to be slightly smaller than power board 12 so that when rail members are positioned over I/O terminals 32 and pin terminals 24 rail members 36 rest on the upper surface of power board 12.

As is shown in FIG. 3, sidewalls 40 include an opening 48 which extends a major portion of the length of the sidewall to allow air provided from, for example, a cooling fan to flow between power board 12 and control board 14. Molded around the periphery of each hole 46 are standoffs 50 which extend above the surface of top wall 42 and precisely control the height of power converter module 10 when it is mounted to the host board.

Other embodiments are within the claims. For example, the embodiment discussed above included a power circuit board 12 and a control circuit board 14; however, the invention is applicable to power converter module assemblies having multi-deck arrangements with more than two circuit boards.

It should also be appreciated that a relatively thin sheet, formed of an insulative material, could be positioned to lie over components of control board 14 prior to mounting rail members 36 to provide a surface upon which labelling information (e.g., pin identification and their voltages, manufacturer, etc.). The thin sheet would include holes sized to fit over spacers 26 as well cutouts through which the terminal pins extend. Spacers 26 may be lengthened slightly to account for the thickness of the insulative sheet.

What is claimed is:

1. A multi-deck power converter module assembly for connection with a substrate having connection regions disposed on a surface of the substrate, the power converter comprising:

a first circuit board;

a second circuit board positioned over the first circuit board, the second circuit board having apertures extending from an upper surface to a lower surface of the second circuit board;

a member positioned over the second circuit board and having a first plurality of holes and a second plurality of holes, the member including a sidewall having an opening which provides an airflow path to the first and second circuit boards;

a pair of spacers disposed between the first and second circuit boards, each spacer extending through one of the apertures of the second circuit board and received within one of the first plurality of holes of the member; and terminal pins attached to the first circuit board for connection to one of the connection regions on the substrate, wherein each of the second plurality of holes is sized to allow the member to be slidably positioned over the terminal pins during assembly of the power converter module.

2. The multi-deck power converter module assembly of claim 1 wherein the member includes standoffs which contact and space the module from the surface of the substrate when the module assembly is mounted to the substrate.

3. The multi-deck power converter module assembly of claim 1 wherein the member includes a sidewall having an opening which provides an airflow path to the first and second circuit boards.

4. The multi-deck power converter module assembly of claim 1 wherein each of the spacers have shoulders for accurate positioning of boards.

5. The multi-deck power converter module assembly of claim 1 wherein each spacer includes an end extending through one the first plurality of holes of the member, the end being knurled to capture the circuit board.

6. The multi-deck power converter module assembly of claim 1 wherein the first circuit board includes a heat sink attached thereto.

7. The multi-deck power converter module assembly of claim 1 wherein the first and second circuit boards are electrically interconnected.

8. The multi-deck power converter module assembly of claim 1 wherein the multi-deck power converter module assembly is a DC—DC converter.

9. The multi-deck power converter module assembly of claim 1 wherein the first circuit board includes power components and the second circuit board includes control components.

10. The multi-deck power converter module assembly of claim 1 wherein the second circuit board has a surface area smaller than a surface area of the first circuit board.

11. The multi-deck power converter module assembly of claim 2 wherein the member includes a sidewall having an opening which provides an airflow path to the first and second circuit boards.

12. A multi-deck DC—DC converter module assembly for connection with a substrate having connection regions disposed on a surface of the substrate, the power converter comprising:

a first circuit board;

a second circuit board positioned over the first circuit board, the second circuit board having apertures extending from an upper surface to a lower surface of the second circuit board;

at least one member positioned over the second circuit board and having a first plurality of holes and a second plurality of holes, the member including:

a sidewall having an opening which provides an airflow path to the first and second circuit boards;

standoffs which contact and space the module assembly from the surface of the substrate when the module assembly is mounted to the substrate;

a pair of spacers disposed between the first and second circuit boards, each spacer extending through one of the apertures of the second circuit board and received within one of the first plurality of holes of the member; and terminal pins attached to the first circuit board, at least one terminal pin extending through the second circuit board and a corresponding one of the second plurality of holes for connection to one of the connection regions on the substrate, wherein each of the second plurality of holes of the member sized to allow the member to be slidably positioned over the terminal pins.

13. The multi-deck DC—DC converter module assembly of claim 12 wherein the member has a rectangular shape and the first plurality of holes are disposed at ends of the member.

14. The multi-deck power converter module assembly of claim 11 wherein each of the spacers have shoulders for accurate positioning of boards.

15. The multi-deck power converter module assembly of claim 11 wherein each spacer includes and end extending through one the first plurality of holes of the member, the end being knurled to capture the circuit board.

16. The multi-deck power converter module assembly of claim 11 wherein the first circuit board includes a heat sink attached thereto.

17. The multi-deck power converter module assembly of claim 11 wherein the first and second circuit boards are electrically interconnected.

* * * * *